United States Patent
Shibata et al.

(10) Patent No.: US 9,859,095 B2
(45) Date of Patent: Jan. 2, 2018

(54) ELECTRON MICROSCOPE AND MEASUREMENT METHOD

(71) Applicants: The University of Tokyo, Tokyo (JP); JEOL Ltd., Tokyo (JP)

(72) Inventors: Naoya Shibata, Tokyo (JP); Yuji Kohno, Tokyo (JP); Hidetaka Sawada, Tokyo (JP)

(73) Assignees: The University of Tokyo, Tokyo (JP); JEOL Ltd., Tokyo (JP)

( * ) Notice: Subject to any disclaimer, the term of this patent is extended or adjusted under 35 U.S.C. 154(b) by 0 days.

(21) Appl. No.: 15/151,792

(22) Filed: May 11, 2016

(65) Prior Publication Data

US 2017/0025248 A1 Jan. 26, 2017

(30) Foreign Application Priority Data

May 14, 2015 (JP) ................................ 2015-099377

(51) Int. Cl.
*H01J 37/244* (2006.01)
*H01J 37/22* (2006.01)
*H01J 37/09* (2006.01)
*H01J 37/26* (2006.01)
*H01J 37/28* (2006.01)

(52) U.S. Cl.
CPC ............ *H01J 37/244* (2013.01); *H01J 37/09* (2013.01); *H01J 37/226* (2013.01); *H01J 37/26* (2013.01); *H01J 37/28* (2013.01); *H01J 2237/0453* (2013.01); *H01J 2237/24578* (2013.01); *H01J 2237/2614* (2013.01); *H01J 2237/2802* (2013.01)

(58) Field of Classification Search
CPC .......... H01J 37/222; H01J 37/28; H01J 37/10; H01J 37/153; H01J 2237/2802; H01J 2237/221; H01J 2237/24592; H01J 2237/1534
USPC ................................ 250/306, 307, 310, 311
See application file for complete search history.

(56) References Cited

U.S. PATENT DOCUMENTS

2016/0178543 A1* 6/2016 Schillinger .......... G01N 23/225
250/307
2016/0372304 A1* 12/2016 Masnaghetti ........... H01J 37/28

FOREIGN PATENT DOCUMENTS

JP 2009277618 A 11/2009

* cited by examiner

*Primary Examiner* — Nicole Ippolito
(74) *Attorney, Agent, or Firm* — The Webb Law Firm (57) ABSTRACT

An electron microscope is provided which can measure, with high sensitivity and high positional resolution, an amount of deflection of an electron beam occurring when it is transmitted through a sample. The electron microscope (100) is adapted to measure the amount of deflection of the electron beam (EB) when it is transmitted through the sample (S), and has an electron beam source (10) producing the electron beam (EB), an illumination lens system for focusing the electron beam (EB) onto the sample (S), an aperture (30) having an electron beam blocking portion (32) for providing a shield between a central portion (EB1) and an outer peripheral portion (EB2) of the cross section of the beam (EB) impinging on the sample (S), and a segmented detector (20) having a detection surface (22) for detecting the electron beam (EB) transmitted through the sample (S). The detection surface (22) is divided into a plurality of detector segments (D1-D4).

7 Claims, 11 Drawing Sheets

ELECTRON MICROSCOPE AND MEASUREMENT METHOD

BACKGROUND OF THE INVENTION

Field of the Invention

The present invention relates to an electron microscope and measurement method.

Description of Related Art

In scanning transmission electron microscopy (STEM), the differential phase contrast (DPC) method is known as a technique for visualizing electromagnetic fields. In this technique, an amount of deflection occurring when an electron beam is transmitted through a sample is measured, and the electromagnetic field present within the sample that causes the deflection of the beam is calculated (see, for example, JP-A-2009-277618).

Figure 13:
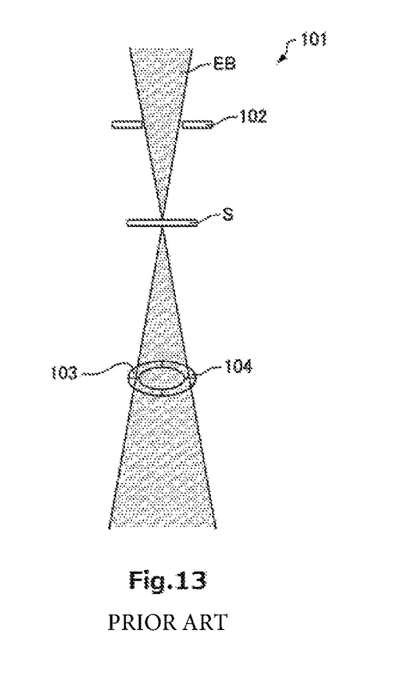
FIG. 13 is an electron ray diagram showing the configuration of a conventional electron microscope in which measurements are made using a segmented detector by a DPC (differential phase contrast) method.
Figure 14:
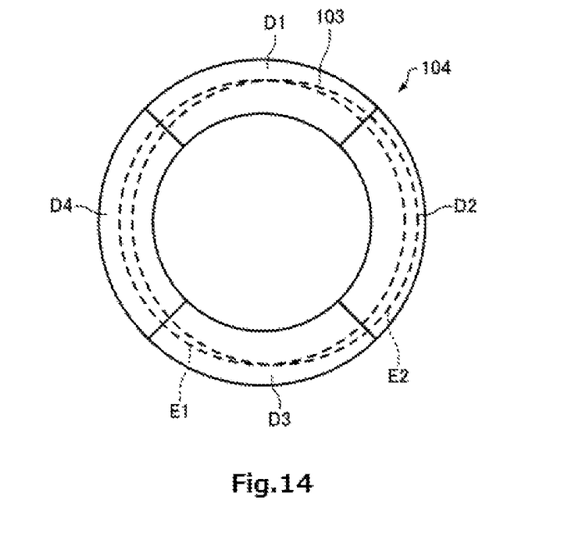
FIG. 14 is a schematic plan view of the segmented detector shown in FIG. 13.

FIG. 13 schematically illustrates the operation of a conventional electron microscope, 101, performed when measurements are made by the DPC method using a segmented detector 104. Note that FIG. 13 shows only main portions of the electron microscope 101. FIG. 14 is a schematic representation of the segmented detector 104.

As shown in FIG. 13, an electron beam EB produced by an electron beam source (not shown) is focused onto a sample S by an illumination lens system (not shown). At this time, the angle of convergence is limited by a condenser aperture 102. A part of the electron beam EB transmitted through the sample S is detected by the segmented detector 104 located behind the sample S.

As shown in FIG. 14, the segmented detector 104 has four detector segments D1, D2, D3, and D4 obtained by circumferentially and equally dividing an annular detection surface 103 into four. The amounts of electrons impinging on the detector segments D1, D2, D3, and D4, respectively, can be detected at the same time. The optical distance (camera length) between the sample S and the segmented detector 104 can be adjusted with an imaging lens system (not shown).

Where a measurement is made using a DPC method, the camera length is so adjusted that the periphery of the cross section of the transmitted electron beam lies within the detection surface 103 of the segmented detector 104 as shown in FIG. 14. When the electron beam EB is deflected by the sample S, the position of the transmitted electron beam on the detection surface 103 deviates, whereby detection signals arising from the four separate detector segments D1-D4 increase or decrease. In the example shown in FIG. 14, an area E1 on the detection surface 103 irradiated with the transmitted electron beam is deflected by the sample S to an area E2.

Figure 15:
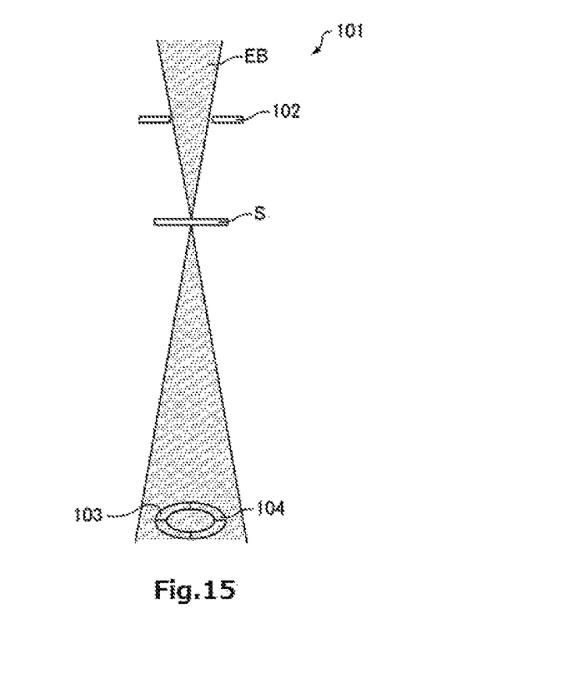
FIGS. 15 and 16 are electron ray diagrams illustrating the operation of the conventional electron microscope.

It is possible to know the amount of deflection of the electron beam EB by extracting increases and decreases in the detection signals arising from the detector segments D1-D4 through additions and subtractions and thus the distribution of the electromagnetic field within the sample S can be found. Because the periphery of the cross section of the transmitted electron beam lies within the detection surface 103, the increases and decreases in the detection signals from the detector segments D1-D4 produced when the irradiated area moves can be increased.

Where the amount of deflection of the electron beam EB caused by the sample S is small, the amount of movement of the transmitted electron beam on the detection surface 103 is also small and, therefore, it is more difficult to detect the amount of movement. In this case, as shown in FIG. 15, it is effective to increase the amount of motion of the electron beam on the detection surface 103 by increasing the camera length.

However, if the camera length is increased without varying the illumination system, transmitted electrons are distributed over a wider area, i.e., the diameter of the electron beam increases. Therefore, as shown in FIG. 15, the transmitted electron beam illuminates the whole detection surface 103. This reduces the ratios of the amounts of variation of signals from the detector segments D1-D4 to the amount of motion of the irradiated area on the detection surface 103. Consequently, it is more difficult to measure the amount of deflection of the electron beam EB with high sensitivity.

Figure 16:
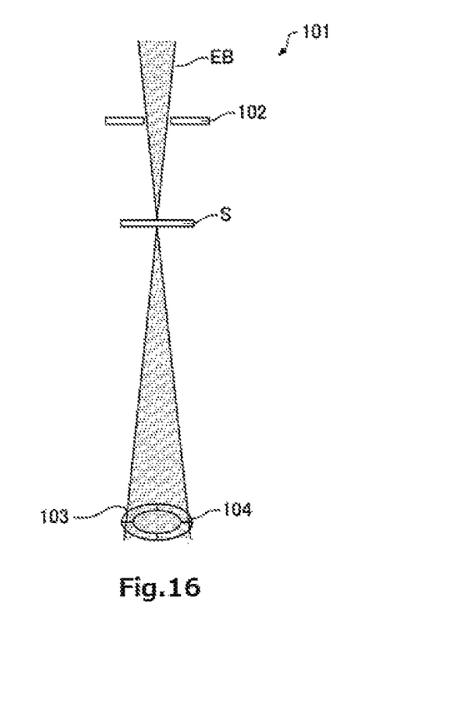

Accordingly, it is conceivable to adopt a technique of reducing the angle of impingement on the sample S, for example, by reducing the hole diameter in the aperture of the illumination system as shown in FIG. 16. This can enhance the sensitivity with which the amount of deflection of the electron beam EB caused by the sample S is detected. Nonetheless, the angle of convergence decreases and so diffraction deteriorates the positional resolution.

In this way, with the conventional electron microscope, if the camera length is increased in an attempt to enhance the sensitivity with which the amount of deflection of the electron beam made by the electromagnetic field within the sample is detected, the angle of convergence must be reduced according to the size of the detection surface 103, thus restricting the positional resolution.

SUMMARY OF THE INVENTION

In view of the foregoing problem the present invention has been made. One object associated with some aspects of the present invention is to provide an electron microscope in which an amount of deflection occurring when an electron beam is transmitted through a sample can be measured with high sensitivity and high positional resolution. Another object associated with some aspects of the invention is to provide a measurement method capable of measuring, with high sensitivity and high positional resolution, an amount of deflection occurring when an electron beam is transmitted through a sample.

(1) An electron microscope associated with the present invention is adapted for measurement of an amount of deflection of an electron beam occurring when it is transmitted through a sample and comprises: an electron beam source producing the electron beam; an illumination lens system for focusing the electron beam onto the sample; an aperture having an electron beam blocking portion that provides a shield between a central portion and an outer peripheral portion of the cross section of the electron beam impinging on the sample; and a segmented detector having a detection surface for detecting electrons transmitted through the sample, the detection surface being divided into a plurality of detector segments.

This electron microscope includes the aperture having the electron beam blocking portion that provides a shield between the central portion and the outer peripheral portion of the cross section of the electron beam hitting the sample. Therefore, it is only necessary to adjust the camera length such that the periphery of the central portion of the cross section of the electron beam having a small angle of convergence lies within the detection surface of the segmented detector. This makes it possible to increase the camera length, for example, as compared with the case where an aperture having no electron beam blocking portion is used.

Hence, an amount of deflection occurring when the electron beam is transmitted through the sample can be measured with high sensitivity.

Furthermore, in this electron microscope, the interference pattern of the electron beam can be varied by adding the outer peripheral portion to the central portion of the cross section of the electron beam that has a small angle of convergence. This can suppress the spread of the probe diameter on the sample surface, for example, as compared with the case where only the central portion of the cross section of the beam is made to hit the sample. As a result, the positional resolution can be enhanced.

In this electron microscope, therefore, even where high positional resolution is obtained, the camera length is increased and an amount of deflection of the electron beam caused by the sample can be measured with high sensitivity. In consequence, with this electron microscope, an amount of deflection occurring when the electron beam is transmitted through the sample can be measured with high sensitivity and high positional resolution.

(2) In one feature of this electron microscope, the aperture may have: a first aperture hole permitting passage of the central portion therethrough; and an annular, second aperture hole permitting passage of the outer peripheral portion therethrough.

In this electron microscope, if the outside diameter of the second aperture hole is increased and high positional resolution is obtained, the camera length can be increased by reducing the diameter of the first aperture hole. Therefore, with this electron microscope, the amount of deflection occurring when the electron beam is transmitted through the sample can be measured with high sensitivity and high positional resolution.

(3) In another feature of the electron microscope set forth in (1) above, the aperture may have a first aperture portion and a second aperture portion. The first aperture portion may have a first aperture hole permitting passage of the electron beam therethrough. The second aperture portion may have a second aperture hole permitting passage of the central portion of the cross section of the electron beam passed through the first aperture hole. The second aperture portion may also have a third aperture hole permitting passage of the outer peripheral portion of the cross section of the electron beam passed through the first aperture hole.

In this electron microscope, the aperture is composed of two stages of aperture portions, i.e., the first aperture portion and the second aperture portion. Therefore, after a normal electron microscope image is obtained by the use of only the first aperture portion, for example, the second aperture portion can be inserted and an electron microscope image can be derived by the DPC method. Consequently, it is easy to obtain both a normal electron microscope image and a DPC-based electron microscope image from the same area of the sample.

(4) In a further feature of the electron microscope set forth in any one of (1) to (3), there may be further provided a camera length control lens system for controlling a camera length such that the periphery of the cross section of the transmitted electron beam emitted from the sample after impingement of the central portion on the sample lies within the detection surface of the segmented detector.

(5) In one feature of the electron microscope set forth in (4) above, there may be further provided a dark field detector located between the sample and the segmented detector and operative to detect scattered electrons and diffracted electrons out of electrons transmitted through the sample.

In this electron microscope, the dark field detector is located between the sample and the segmented detector and, therefore, it is possible to obtain a dark field image and a DPC-based electron microscope image at the same time.

(6) In one feature of this electron microscope of (5), the camera length control lens system may be mounted between the dark field detector and the segmented detector.

In this electron microscope, if a sufficient physical distance cannot be provided between the dark field detector and the segmented detector, for example, the camera length for the segmented detector can be set large.

(7) A measurement method associated with the present invention is adapted to measure an amount of deflection of an electron beam occurring when the beam is transmitted through a sample in an electron microscope equipped with a segmented detector having a detection surface that is divided into a plurality of detector segments. This measurement method starts with placing an aperture having an electron beam blocking portion that provides a shield between a central portion and an outer peripheral portion of the cross section of the electron beam impinging on the sample. A camera length is adjusted such that the periphery of the cross section of the transmitted electron beam lies within the detection surface, the beam being emitted from the sample in response to impingement of the central portion of the cross section of the beam on the sample. Electron microscope images are taken from the detector segments, respectively.

In this measurement method, the camera length is so adjusted that the periphery of the cross section of the transmitted electron beam lies within the detection surface, the beam being emitted from the sample in response to impingement of the central portion of the cross section of the beam on the sample. Consequently, the amount of deflection of the beam occurring when it is transmitted through the sample can be measured with high sensitivity and high positional resolution.

DESCRIPTION OF THE INVENTION

The preferred embodiments of the present invention are hereinafter described in detail with reference to the drawings. It is to be understood that the embodiments described below are not intended to unduly restrict the content of the present invention delineated by the claims and that not all the configurations described below are essential constituent components of the invention.

1. First Embodiment 1.1. Electron Microscope

Figure 1:
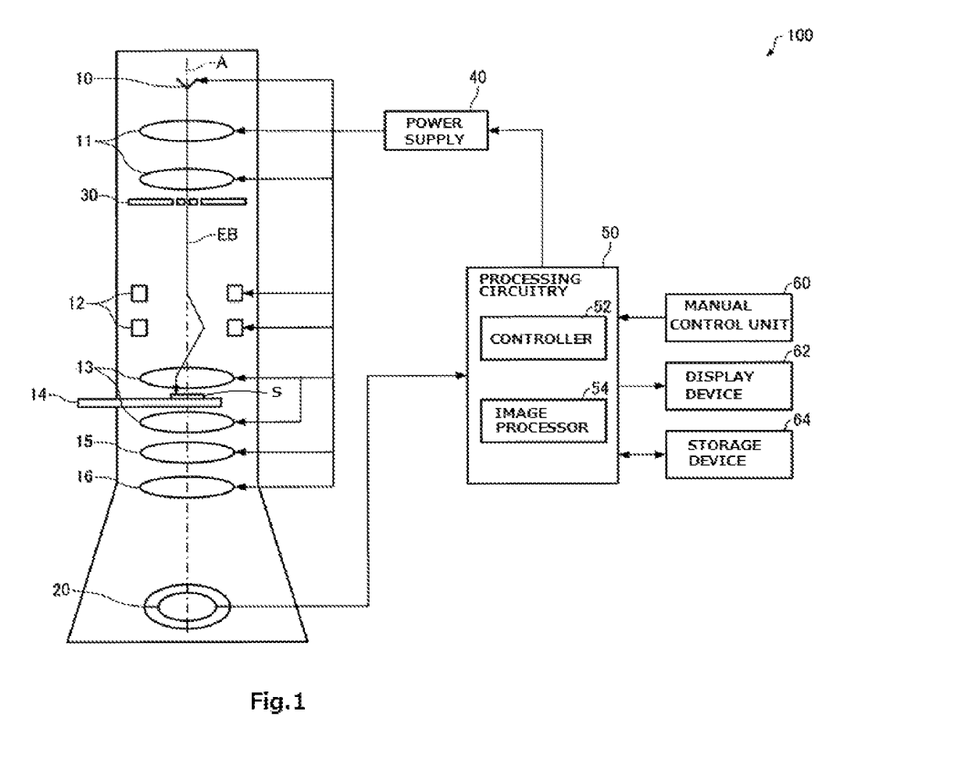
FIG. 1 is a schematic representation, partly in block form, of an electron microscope associated with a first embodiment of the present invention.

An electron microscope associated with a first embodiment of the present invention is first described by referring to FIG. 1, which schematically shows the configuration of the electron microscope, 100.

In the electron microscope 100, an amount of deflection of an electron beam EB occurring when it is transmitted through a sample S can be measured. Electromagnetic fields within the sample that cause the deflection of the beam can be computed from the results of the measurement by a DPC (differential phase contrast) method.

As shown in FIG. 1, the electron microscope 100 includes an electron beam source 10, an illumination lens system 11, a deflector 12, an objective lens 13, a sample stage 14, an intermediate lens 15, a projector lens 16, a segmented detector 20, a condenser aperture 30, a power supply 40, processing circuitry 50, a manual control unit 60, a display device 62, and a storage device 64.

The electron beam source 10 emits the electron beam EB. An electron gun such as a thermionic-emission electron gun, thermal field-emission electron gun, or cold field-emission electron gun can be used as the electron beam source 10.

The illumination lens system 11 converges the electron beam EB generated by the electron beam source 10. The condenser aperture 30 operates to determine the angle of convergence (angle of incidence) of the electron beam EB impinging on the sample S. The condenser aperture 30 separates the cross section of the electron beam EB into a central portion of a small angle of convergence and an outer peripheral portion of a large angle of convergence as described later. Details of the condenser aperture 30 will be described later.

The deflector 12 deflects the electron beam EB. The deflector 12 can scan the converged electron beam EB over the sample S by supplying a scan signal to the deflector 12 from the power supply 40. Consequently, the electron microscope 100 can be operated as a scanning transmission electron microscope (STEM).

The objective lens 13 focuses the electron beam EB onto the sample S and is used to image electrons transmitted through the sample S.

The sample stage 14 holds the sample S. Also, the sample stage 14 can move the sample S horizontally and vertically. Furthermore, the sample stage 14 can tilt the sample S.

The intermediate lens 15 focuses the image plane or back focal plane (diffraction plane) of the objective lens 13 onto the object plane of the projector lens 16. The projector lens 16 focuses the image plane of the intermediate lens 15 onto the detection surface 22 (see FIG. 2) of the segmented detector 20.

Figure 2:
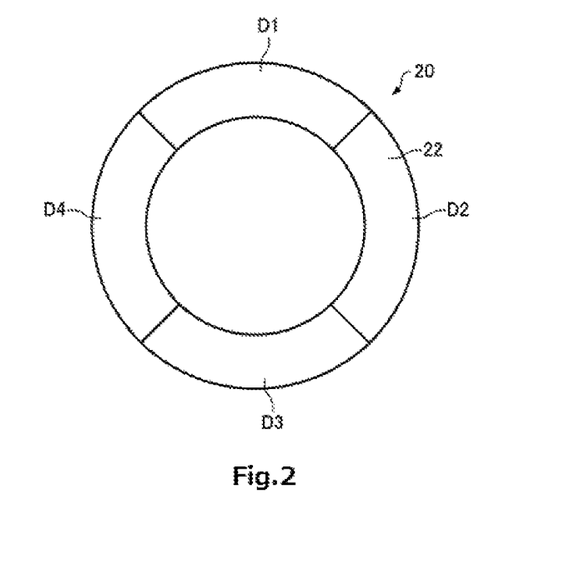
FIG. 2 is a schematic plan view of a segmented detector shown in FIG. 1.

The segmented detector 20 is located behind (i.e., on the downstream side relative to the direction of travel of the electron beam EB) the projector lens 16. FIG. 2 is a schematic plan view of the segmented detector 20.

As shown in FIG. 2, the detection surface 22 of the segmented detector 20 is divided into a plurality of detector segments D1, D2, D3, and D4. In the example shown in FIG. 2, the segmented detector 20 has the four detector segments D1, D2, D3, and D4 obtained by circumferentially and equally dividing the annular detection surface 22 into four. Doses of electrons impinging on the detector segments D1, D2, D3, and D4 can be detected at the same time.

No restriction is placed on the number of division of the detection surface 22, i.e., the number of the detector segments. The segmented detector 20 can have two or more detector segments. The segmented detector 20 may have plural detector segments by dividing the detection surface 22 angularly and concentrically in an unillustrated manner. For example, the segmented detector 20 may have 16 detector segments by angularly dividing the detection surface 22 into four and concentrically dividing the detection surface 22 into four.

For example, the segmented detector 20 has an electron-to-light converter (scintillator) for converting an electron beam into light, the converter being divided into the plural detector segments D1, D2, D3, and D4, light transmission paths (bundles of optical fibers) for transmitting light streams from the detector segments D1-D4, respectively, and light detectors (photomultiplier tubes) for converting the light streams coming from the detector segments D1-D4 through the light transmission paths into respective electrical signals in an unillustrated manner.

The power supply 40 applies voltages or currents to the electron beam source 10 and to the electron optical elements 11, 12, 13, 15, and 16 on the basis of control signals from a controller 52.

The manual control unit 60 performs processing to obtain a control signal responsive to a user's manipulation and to send the signal to the processing circuitry 50. For example, the manual control unit 60 is made up of buttons, keys, a touch panel display, or a microphone. The manual control unit 60 accepts input values indicative of a final magnification from a user and an observed field of view, respectively, for example.

The display device 62 displays images generated by the processing circuitry 50. The function of the display device 62 can be implemented by an LCD, a CRT, or the like. The display device 62 displays, for example, a scanning transmission electron microscope (STEM) image generated by an image processor 54.

The storage device 64 acts as a working area for the processing circuitry 50. The function of the storage device 64 can be implemented by a RAM or the like. The storage device 64 stores programs, data, and related information permitting the processing circuitry 50 to perform various control operations and calculational operations. Furthermore, the storage device 64 is used to temporarily store the results of calculations performed by the processing circuitry 50 in accordance with various programs.

The processing circuitry 50 performs various control operations and calculational operations in accordance with programs stored in the storage device 64. The processing circuitry 50 functions as the controller 52 and as the image processor 54 (described later) by executing programs stored in the storage device 64. The functions of the processing circuitry 50 can be implemented either by hardware such as various processors (e.g., CPU and DSP) or ASIC (e.g., a gate array) or by software. At least a part of the processing circuitry 50 may be implemented by hardware (dedicated circuitry).

The processing circuitry 50 includes the controller 52 and the image processor 54. The controller 52 performs processing to control output voltages or output currents from the power supply 40 which are used to apply voltages or currents to the electron beam source 10 and to the optics 11, 12, 13, 15, and 16 constituting the electron microscope 100.

The image processor 54 performs processing to generate an STEM image using the output signal from the segmented detector 20. The image processor 54 can perform processing, for example, to generate a bright-field STEM image from each of the detector segments D1, D2, D3, and D4 of the segmented detector 20 and to generate an image by computationally processing (such as by additions and subtractions) detection signals arising from the detector segments D1, D2, D3, and D4. That is, the image processor 54 can generate an STEM image by a DPC method from the results of detection performed by the segmented detector 20.

The condenser aperture 30 is now described. This condenser aperture 30 is located ahead of the sample S (i.e., on the upstream side relative to the direction of travel of the electron beam EB). The condenser aperture 30 is incorporated within an illumination system for causing the electron beam EB generated by the electron beam source 10 to impinge on the sample S. No restriction is imposed on the position of the condenser aperture 30 as long as it is ahead of the sample S.

Figure 3:
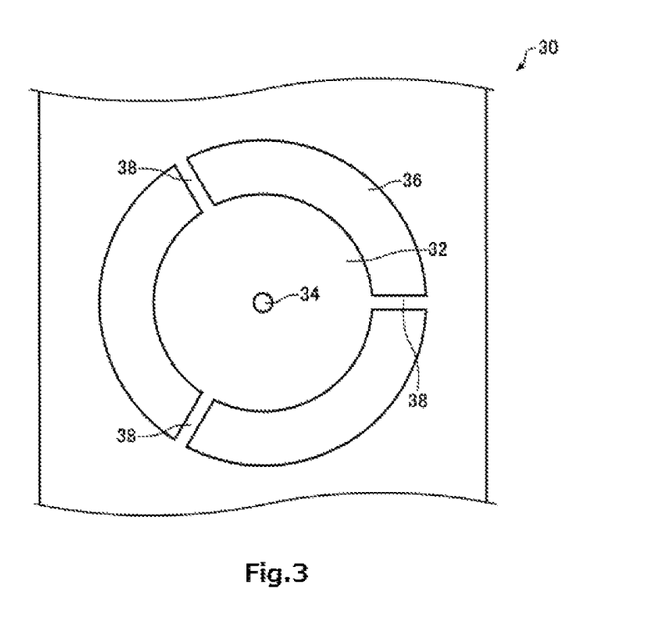
FIG. 3 is a schematic plan view of a condenser aperture shown in FIG. 1.

FIG. 3 is a schematic plan view of the condenser aperture 30. As shown in FIG. 3, the condenser aperture 30 has an electron beam blocking portion 32 that provides a shield between the central portion and the outer peripheral portion of the cross section of the electron beam EB incident on the sample S. Furthermore, the condenser aperture 30 has a first aperture hole 34 permitting passage of the central portion of the cross section of the beam EB therethrough and an annular, second aperture hole 36 permitting passage of the outer peripheral portion of the cross section of beam EB. The beam blocking portion 32 is a region located between the first aperture hole 34 and the second aperture hole 36. In the example shown in FIG. 3, the first aperture hole 34 is circular in shape but no restriction is placed on the shape of the first aperture hole 34. The second aperture hole 36 is annular or toroidal in shape, for example. The electron beam blocking portion 32 is supported by a plurality of bridge portions 38. No restrictions are placed on the number and shape of the bridge portions 38.

In the electron microscope 100, the central portion and the outer peripheral portion of the cross section of the electron beam EB incident on the sample S are shielded from each other by the condenser aperture 30 and thus the cross section of the beam EB are separated into both the central portion close to the optical axis A and the outer peripheral portion remote from the optical axis A. Then, the electron beam EB whose central and outer peripheral portions have been separated is made to impinge on the sample S. The optical axis A passes through the centers of the lenses 11, 13, 15, and 16 constituting the optical system of the electron microscope 100.

1.2. Measurement Method

Figure 4:
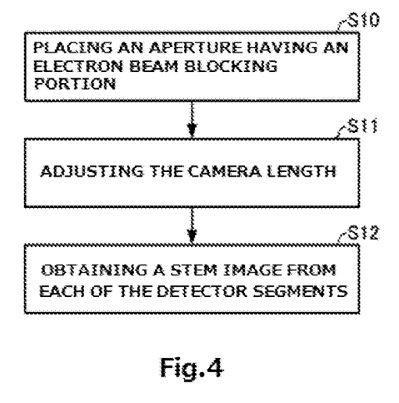
FIG. 4 is a flowchart illustrating one example of a measurement method associated with the first embodiment.
Figure 5:
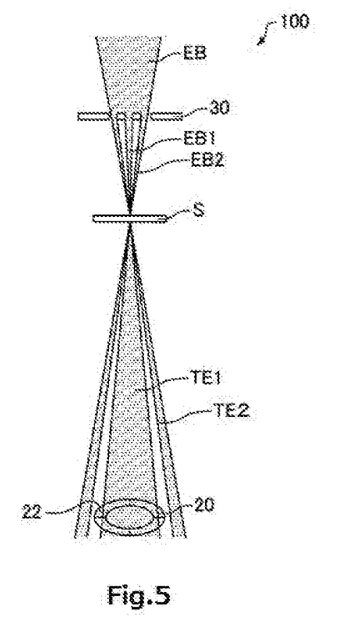
FIG. 5 is an electron ray diagram illustrating the operation of the electron microscope shown in FIG. 1.
Figure 6:
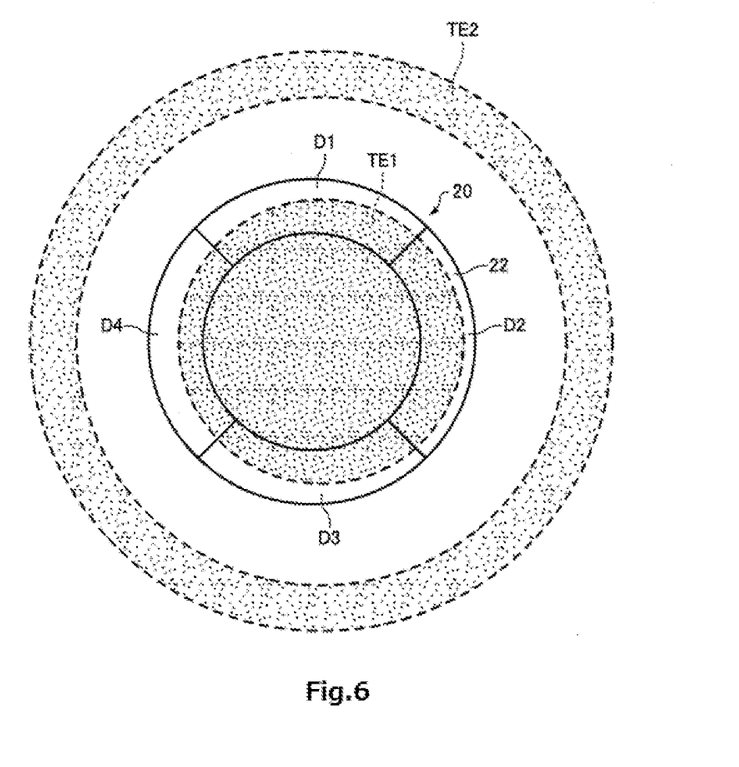
FIG. 6 is a plan view illustrating the operation of the electron microscope shown in FIG. 1.

A DPC method of measuring an amount of deflection of the electron beam EB by the use of the electron microscope 100 associated with the first embodiment is next described, the deflection occurring when the beam passes through the sample S. FIG. 4 is a flowchart illustrating one example of the measurement method associated with the first embodiment. FIGS. 5 and 6 illustrate the operation of the electron microscope 100 associated with the first embodiment.

First, as shown in FIG. 5, the condenser aperture 30 is placed which has the electron beam blocking portion 32 providing a shield between the central portion EB1 and the outer peripheral portion EB2 of the cross section of the electron beam EB hitting the sample S (step S10).

In the electron microscope 100, the electron beam EB produced by the electron beam source 10 is converged by the illumination lens system 11 and focused onto the sample S by the objective lens 13. As shown in FIG. 5, the placement of the condenser aperture 30 separates the cross section of the electron beam EB into the central portion EB1 of small angle of convergence and the outer peripheral portion EB2 of large angle of convergence while the beam is focused onto the sample S.

Then, as shown in FIGS. 5 and 6, the camera length is so adjusted that the periphery of the cross section of a transmitted electron beam TE1 lies within the detection surface 22, the beam being emitted from the sample S in response to impingement of the central portion EB1 of the cross section of the electron beam EB on the sample S (step S11). In FIG. 6, the periphery of the cross section of the transmitted electron beam TE1 and the periphery of a transmitted electron beam TE2 (described later) are indicated by broken lines.

The transmitted electron beam referred to herein is composed of those electrons of the electron beam which pass through the sample S without being scattered, and is also referred to as the direct electron beam. A bright-field STEM image is obtained by detecting the transmitted electron beam.

The camera length is adjusted by adjusting one or more lenses of the imaging system such as the intermediate lens 15 and the projector lens 16. For example, if the user enters a desired value of camera length via the manual control unit 60, the controller 52 controls the power supply 40 on the basis of the entered value. A given current is supplied into the lens of the imaging system. As a result, the camera length is set.

As this time, it is desirable to adjust the camera length such that the whole periphery of the cross section of the transmitted electron beam TE1 is positioned within the detection surface 22 as shown in FIG. 6. Alternatively, the camera length may be so adjusted that a part of the periphery of the cross section of the transmitted electron beam TE1 lies within the detection surface 22 in an unillustrated manner.

The amounts of variation of the output signals from the detector segments D1, D2, D3, and D4 per unit motion of the transmitted electron beam TE1 on the detection surface 22 can be increased by adjusting the camera length such that the periphery of the cross section of transmitted electron beam TE1 lies within the detection surface 22 of the segmented detector 20 in this way.

The transmitted electron beam TE2 emitted from the sample S in response to impingement of the outer peripheral portion EB2 of the cross section of the electron beam EB on the sample S impinges outside the detection surface 22. That is, the transmitted electron beam TE2 is not detected by the segmented detector 20.

Then, a bright-field STEM image is obtained from each of the detector segments D1, D2, D3, and D4 of the segmented detector 20 (step S12).

In particular, in the electron microscope 100, the electron beam EB emitted from the electron beam source 10 is converged by the illumination lens system 11, and the cross section of the beam is separated into its central portion EB1 and outer peripheral portion EB2 by the condenser aperture 30. The beam is focused onto the sample S by the objective lens 13. The detection signals from the detector segments D1, D2, D3, and D4 of the segmented detector 20 are accepted by the processing circuitry 50 while the focused electron beam EB is being scanned over the sample S by the deflector 12. The image processor 54 takes the intensity of a detection signal at each point on the sample S as a pixel intensity on an image and generates a bright-field STEM image for each of the detector segments D1, D2, D3, and D4. The generated STEM images for the individual detector segments D1-D4 are stored in the storage device 64 and displayed on the display device 62.

Information about an amount of deflection of the electron beam EB occurring when it passes through the sample S, i.e., information about the electromagnetic field within the sample S, can be obtained from the DPC-based STEM images derived in this way for the individual detector segments D1, D2, D3, and D4. Because of the processing steps described so far, the amount of deflection of the electron beam EB when it is transmitted through the sample S can be measured.

The electron microscope 100 has the following features. In the electron microscope 100, the condenser aperture 30 has the electron beam blocking portion 32 that provides a shield between the central portion and the outer peripheral portion of the cross section of the electron beam EB hitting the sample S. Consequently, it is only necessary to adjust the camera length such that the periphery of the central portion EB1 of the cross section of the beam EB having a small angle of convergence lies within the detection surface 22 of the segmented detector 20. Hence, the camera length can be increased as compared with the case where an aperture not having the electron beam blocking portion 32 is used.

For example, if the condenser aperture 30 does not have the electron beam blocking portion 32, the camera length must be adjusted such that the periphery of the cross section of the transmitted electron beam emitted in response to impingement of an electron beam having a large angle of convergence on the sample S is brought within the detection surface 103 of the segmented detector 104 as shown in FIG. 13 and thus the camera length decreases. In contrast, where the condenser aperture 30 has the electron beam blocking portion 32, it is only necessary to adjust the camera length so that the periphery of the cross section of the transmitted electron beam TE1 lies within the detection surface 22 of the segmented detector 20 as shown in FIG. 5 and so the camera length can be increased.

In this way, in the electron microscope 100, the condenser aperture 30 has the electron beam blocking portion 32. This makes it possible to increase the camera length. In consequence, an amount of deflection of the electron beam EB occurring when it is transmitted through the sample S can be measured with high sensitivity.

Furthermore, in the electron microscope 100, the condenser aperture 30 has the electron beam blocking portion 32. This allows for variations of the interference pattern of the electron beam by adding the outer peripheral portion EB2 to the central portion EB1 of the cross section of the electron beam EB having a small angle of convergence. Consequently, the spread of the diameter of the probe on the surface of the sample S can be suppressed as compared with the case where only the central portion EB1 of the cross section of the electron beam EB is made to impinge on the sample S and thus the positional resolution can be improved. For example, in a conventional electron microscope, the angle of convergence must be reduced as shown in FIG. 16 in order to make measurements by a DPC method with a large camera length. This has increased the probe diameter on the sample surface due to diffraction and deteriorated the positional resolution.

Accordingly, in the electron microscope 100, even under conditions where high positional resolution is obtained, an amount of deflection of the electron beam EB caused by the sample S can be measured with increased sensitivity by increasing the camera length. As a consequence, with the electron microscope 100, an amount of deflection of the electron beam EB occurring when it is transmitted through the sample S can be measured with high sensitivity and high positional resolution.

In the electron microscope 100, the condenser aperture 30 has the first aperture hole 34 permitting passage of the central portion EB1 of the cross section of the electron beam EB and the annular, second aperture hole 36 permitting passage of the outer peripheral portion EB2 of the cross section of the beam EB. Therefore, in the electron microscope 100, even if the outside diameter of the second aperture hole 36 is increased to obtain high positional resolution, the camera length can be increased by reducing the diameter of the first aperture hole 34. Thus, with the electron microscope 100, an amount of deflection of the electron beam EB occurring when it is transmitted through the sample S can be measured with high sensitivity and high positional resolution.

In this manner, in the electron microscope 100, the camera length can be increased by reducing the diameter of the first aperture hole 34 so as to reduce the diameter of the central portion EB1 of the cross section of the electron beam EB. That is, the diameter of the first aperture hole 34 corresponds to the sensitivity with which the amount of deflection of the electron beam EB caused by the sample S is detected. As described previously, in the electron microscope 100, the condenser aperture 30 separates the cross section of the electron beam EB into the central portion EB1 and the outer peripheral portion EB2. Motion of the central portion EB1 is detected while suppressing the effects of the outer peripheral portion EB2. Therefore, a considerable latitude is provided in determining the diameter of the central portion EB1 of the cross section of the electron beam EB (i.e., the deflection sensitivity). Optimum conditions can be selected in accordance with the observed sample S utilizing this latitude.

Further, in the electron microscope 100, the effects of diffraction can be reduced by increasing the diameter of the second aperture hole 36 to thereby increase the outside diameter of the outer peripheral portion EB2 of the cross section of the electron beam EB. As a result, the positional resolution can be enhanced. That is, the outside diameter of the second aperture hole 36 corresponds to the positional resolution. The outside diameter of the second aperture hole 36 is appropriately selected according to aberrations in the optical system and other factors.

In the method of measuring, by the use of the electron microscope 100, an amount of deflection of the electron beam EB occurring when it is transmitted through the sample S, the camera length is so adjusted that the periphery of the cross section of the transmitted electron beam TE1 emitted from the sample S in response to impingement of the central portion EB1 of the cross section of the beam EB on the sample S lies within the detection surface 22 of the segmented detector 20 (step S11). Therefore, as described previously, an amount of deflection of the beam EB when it is transmitted through the sample S can be measured with high sensitivity and high positional resolution.

2. Second Embodiment

2.1. Electron Microscope

Figure 7:
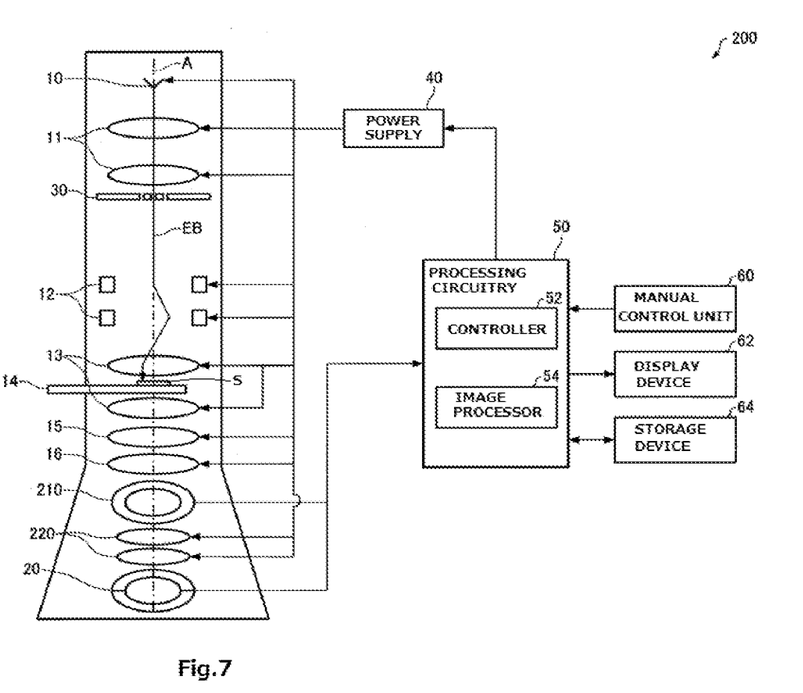
FIG. 7 is a schematic representation, partly in block form, of an electron microscope associated with a second embodiment.

An electron microscope associated with a second embodiment is next described by referring to FIG. 7, which schematically shows the configuration of the electron microscope, 200, associated with the second embodiment. Those members of the electron microscope 200 associated with the second embodiment which are similar in function with their respective counterparts of the electron microscope 100 associated with the first embodiment are indicated by the same reference numerals as in the above referenced figures and a detail description thereof is omitted.

As shown in FIG. 7, the electron microscope 200 differs from the above-described electron microscope 100 in that it has a dark field detector 210 and a camera length control lens system 220.

The dark field detector 210 detects scattered and diffracted electrons out of electrons transmitted through the sample S. For example, the dark field detector 210 is an annular dark-field (ADF) detector for detecting electrons scattered inelastically at high angles. A detection signal arising from the dark field detector 210 is sent to the processing circuitry 50. The image processor 54 generates a high angle annular dark-field (HAADF) STEM image from the detection signal from the dark field detector 210.

The dark field detector 210 is positioned between the sample S and the segmented detector 20. In the illustrated example, the dark field detector 210 is mounted behind (on the downstream side relative to the direction of travel of the electron beam) the projector lens 16. No restriction is placed on the position of the detector 210 as long as it is located between the sample S and the segmented detector 20, in which case the camera length for the dark field detector 210 (i.e., the optical distance between the sample S and the dark field detector 210) can be made smaller than the camera length for the segmented detector 20.

The camera length control lens system 220 is used to control the camera length for the segmented detector 20, and is mounted between the dark field detector 210 and the segmented detector 20. A given current is supplied to the camera length control lens system 220 from the power supply 40.

2.2. Measurement Method

Figure 8:
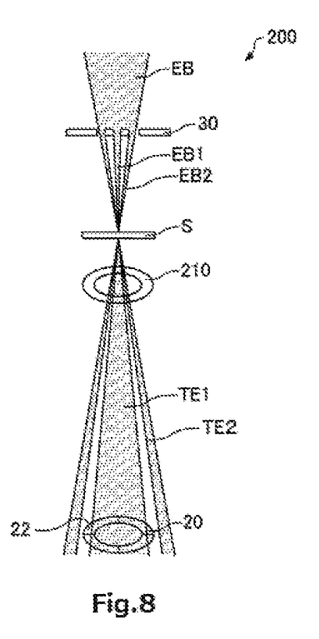
FIG. 8 is an electron ray diagram illustrating the operation of the electron microscope shown in FIG. 7.

A DPC method of measuring, by the use of the electron microscope 200 associated with the second embodiment, an amount of deflection of the electron beam EB occurring when it is transmitted through the sample S is next described. FIG. 8 is a diagram illustrating the operation of the electron microscope 200 associated with the second embodiment. A flowchart illustrating one example of the measurement method associated with the second embodiment is similar to the flowchart of FIG. 4 and thus is omitted from being shown. Only the differences with the measurement method associated with the first embodiment are described; a description of similarities is omitted.

The above-described measurement method associated with the first embodiment involves the step S11 (see FIG. 4) of adjusting the camera length such that the periphery of the cross section of the transmitted electron beam TE1 lies within the detection surface 22 of the segmented detector 20. In this step S11, a lens included in the imaging system is controlled to adjust the camera length. That is, the lens of the imaging system functions as a camera length control lens system.

In contrast, during the camera length adjusting step S11 of the measurement method associated with the second embodiment, the camera length control lens system 220 is controlled to adjust the camera length for the segmented detector 20.

It is possible to provide separate control of the camera length for the dark field detector 210 and the camera length for the segmented detector 20 by controlling the camera length by the use of the camera length control lens system 220. Therefore, as shown in FIG. 8, the camera length for the dark field detector 210 can be reduced, while the camera length for the segmented detector 20 can be increased. Consequently, in the step S12 of obtaining a bright-field STEM image from each of the detector segments D1, D2, D3, and D4 of the segmented detector 20, a bright-field STEM image (DPC-based STEM image) and a dark-field STEM image (HAADF-STEM image) can be obtained at the same time.

The dark field detector 210 and the segmented detector 20 may be physically separated from each other without mounting the camera length control lens system 220 in an unillustrated manner. In this case, a bright-field STEM image and a dark-field STEM image can be similarly obtained simultaneously from each of the detector segments D1-D4 of the segmented detector 20.

The electron microscope 200 includes the dark field detector 210 located between the sample S and the segmented detector 20. Therefore, with the electron microscope 200, the camera length for the dark field detector 210 can be made smaller than the camera length for the segmented detector 20. Consequently, a high-resolution HAADF-STEM image can be obtained simultaneously with a DPC-based STEM image for the following reason. It is necessary to reduce the camera length in order to obtain a high-resolution HAADF-STEM image. In contrast, in order to obtain a DPC-based STEM image, it is necessary to increase the camera length as described previously.

Furthermore, in the electron microscope 200, the camera length control lens system 220 is located between the dark field detector 210 and the segmented detector 20 and, therefore, in the electron microscope 200, the camera length for the segmented detector 20 can be controlled by the camera length control lens system 220. As a consequence, the electron microscope 200 can be miniaturized, for example, as compared with the case where the dark field detector 210 and the segmented detector 20 are physically separated from each other.

3. Third Embodiment

3.1. Electron Microscope

Figure 9:
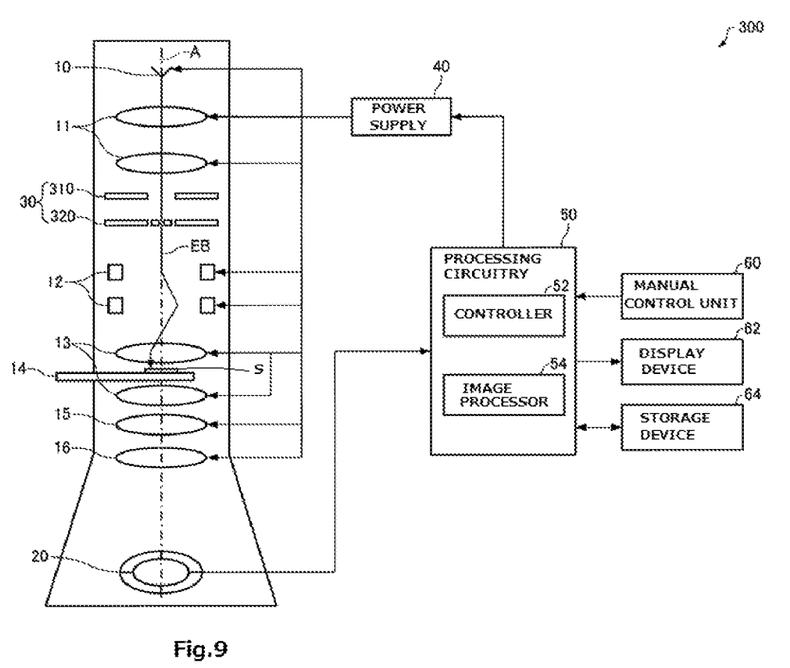
FIG. 9 is a schematic representation, partly in block form, of an electron microscope associated with a third embodiment.

An electron microscope associated with a third embodiment is next described by referring to FIG. 9, which schematically shows the configuration of the electron microscope, 300, associated with the third embodiment. Those members of the electron microscope 300 associated with the third embodiment which are similar in function to their respective counterparts of the electron microscope 100 associated with the first embodiment are indicated by the same reference numerals as in the above referenced figures and a detail description thereof is omitted.

As shown in FIG. 9, the electron microscope 300 differs from the above-described electron microscope 100 in that the condenser aperture 30 is composed of a first aperture portion 310 and a second aperture portion 320. That is, the condenser aperture 30 comprises two stages of aperture portions, i.e., the first aperture portion 310 on the front side and the second aperture portion 320 on the rear side.

Figure 10:
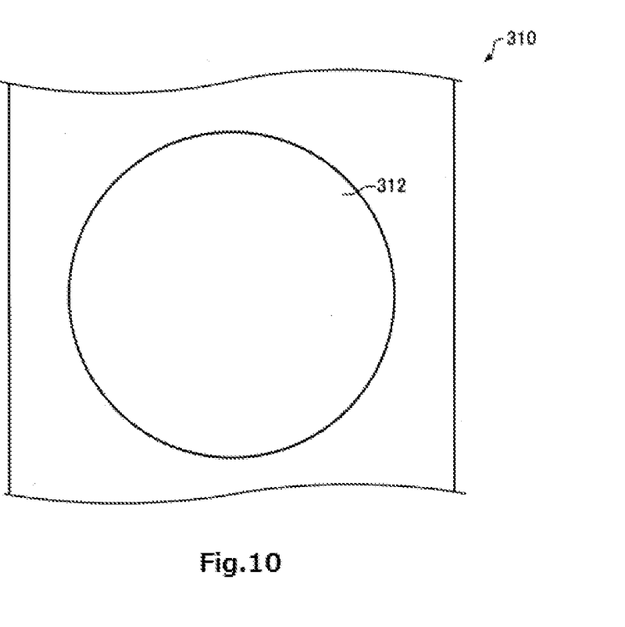
FIG. 10 is a schematic plan view of a first aperture portion of a condenser aperture shown in FIG. 9.
Figure 11:
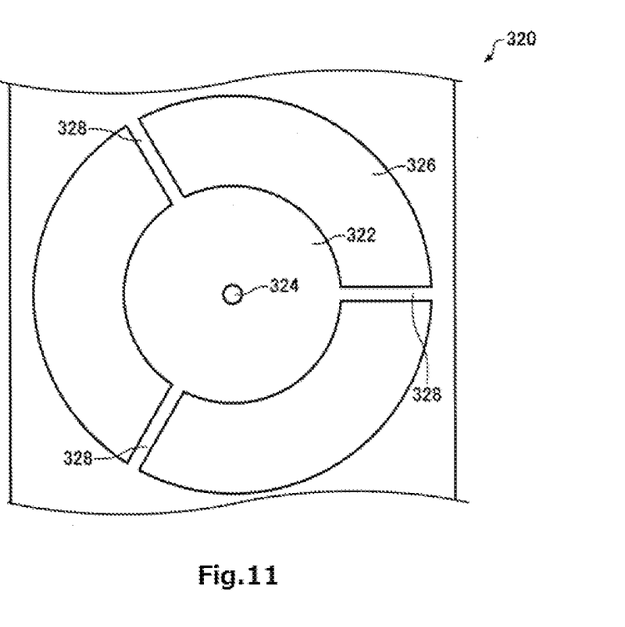
FIG. 11 is a schematic plan view of a second aperture portion of the condenser aperture shown in FIG. 9.

FIG. 10 is a schematic plan view of the first aperture portion 310 of the condenser aperture 30. FIG. 11 is a schematic plan view of the second aperture portion 320 of the aperture 30.

As shown in FIG. 10, the first aperture portion 310 has a first aperture hole 312 permitting passage of the electron beam EB therethrough. In the example shown in FIG. 10, the first aperture hole 312 of the first aperture portion 310 is circular in shape but no restriction is placed on the shape. The diameter of the first aperture hole 312 is smaller than the outside diameter of an annular, third aperture hole 326 shown in FIG. 11 and greater than the inside diameter of the third aperture hole 326.

As shown in FIG. 11, the second aperture portion 320 has an electron beam blocking portion 322 that provides a shield between a central portion and an outer peripheral portion of the cross section of the electron beam EB passed through the first aperture hole 312 of the first aperture portion 310.

The second aperture portion 320 has a second aperture hole 324 permitting passage of the central portion of the cross section of the electron beam EB passed through the first aperture hole 312 and the annular, third aperture hole 326 permitting passage of the outer peripheral portion of the cross section of the beam EB. The electron beam blocking portion 322 is an area located between the second aperture hole 324 and the third aperture hole 326. In the example shown in FIG. 11, the second aperture hole 324 is circular in shape but no restriction is imposed on the shape. For example, the third aperture hole 326 is annular or toroidal in shape. The beam blocking portion 322 is supported by a plurality of bridge portions 328. No restrictions are placed on the number and shape of the bridge portions 328.

The second aperture hole 324 of the second aperture portion 320 corresponds to the first aperture hole 34 shown in FIG. 3. The first aperture hole 312 and third aperture hole 326 of the first aperture portion 310 correspond to the second aperture hole 36 shown in FIG. 3.

Figure 12:
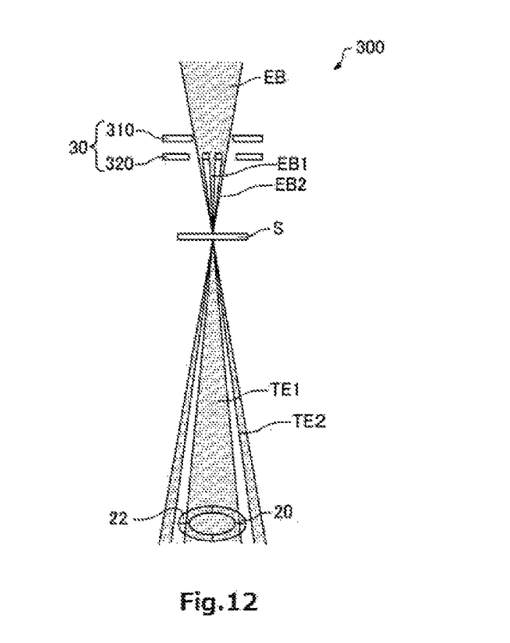
FIG. 12 is an electron ray diagram illustrating the operation of the electron microscope shown in FIG. 9.

FIG. 12 illustrates the operation of the electron microscope 300. As shown in FIG. 12, in the electron microscope 300, the electron beam EB striking the sample S passes through the second aperture hole 324 and third aperture hole 326 of the second aperture portion 320 after passing through the first aperture hole 312 of the first aperture portion 310. Consequently, the central portion EB1 and outer peripheral portion EB2 of the cross section of the electron beam EB are shielded from each other in the same way as done by the condenser aperture 30 (see FIG. 3) of the above-described electron microscope 100. The cross section of the beam EB is separated into the central portion close to the optical axis A and the outer peripheral portion remote from the optical axis A and impinges on the sample S.

3.2. Measurement Method

A measurement method associated with a third embodiment is similar to the above-described measurement method associated with the first embodiment and illustrated in FIG. 4 except that the two stages of aperture portions (310 and 320) are placed during the step S10 of placing the condenser aperture 30 and so a description thereof is omitted.

The electron microscope 300 can yield advantageous effects similar to those produced by the above-described electron microscope 100. Furthermore, the condenser aperture 30 of the electron microscope 300 is composed of two stages of aperture portions (first aperture portion 310 and second aperture portion 320) and, therefore, after obtaining a normal STEM image, for example, using only the first aperture portion 310, a DPC-based STEM image can be obtained using the first aperture portion 310 and the second aperture portion 320 by inserting the second aperture portion 320. Consequently, a normal STEM image and a DPC-based STEM image can be easily derived from the same region on the sample S.

The dark field detector 210 and the camera length control lens system 220 shown in FIG. 7 may be incorporated into the electron microscope of FIG. 9 in an unillustrated manner. Consequently, with the electron microscope 300, too, a bright-field STEM image and a dark-field STEM image can be obtained simultaneously.

4. Modification

It is to be understood that the present invention is not restricted to the foregoing embodiments and that the invention can be implemented in various forms without departing from the scope of the present invention.

For example, in some of the above embodiments, the segmented detector 20 whose detection surface is divided into a plurality of detector segments is configured including an electron-to-light converter, light transmission paths, and optical detectors. The segmented detector is not restricted to this configuration as long as the segmented detector can detect movement of transmitted electrons. For instance, a CCD (charge-coupled device) camera may be used as the segmented detector of the electron microscope associated with the present invention.

Where a CCD camera is used as a segmented detector, during the step S11 (FIG. 4) of adjusting the camera length such that the periphery of the cross section of a transmitted electron beam lies within the detection surface, the camera length is so adjusted that the periphery of the cross section of the transmitted electron beam lies within the detection surface (light-sensitive surface) of the CCD camera.

The present invention embraces configurations substantially identical (e.g., in function, method, and results or in purpose and advantageous effects) with the configurations described in the embodiments of the invention. Furthermore, the invention embraces configurations described in the embodiments and including portions which have non-essential portions replaced. In addition, the invention embraces configurations which produce the same advantageous effects as those produced by the configurations described in the embodiments or which can achieve the same objects as the configurations described in the embodiments. Further, the invention embraces configurations which are similar to the configurations described in the embodiments except that well-known techniques have been added.

Having thus described our invention with the detail and particularity required by the Patent Laws, what is desired protected by Letters Patent is set forth in the following claims.

The invention claimed is:

1. An electron microscope for measuring an amount of deflection of an electron beam occurring when it is transmitted through a sample, said electron microscope comprising:

an electron beam source producing the electron beam;

an illumination lens system for focusing the electron beam onto the sample;

an aperture having an electron beam blocking portion that provides a blocking shield between a central portion and an outer peripheral portion of the cross section of the electron beam such that the beam impinging on the sample has a central portion and a separated outer peripheral portion; and a segmented detector having a detection surface for detecting electrons of the central portion of the beam transmitted through the sample, the detection surface being divided into a plurality of detector segments.

2. The electron microscope as set forth in claim 1, wherein said aperture has a first aperture hole permitting passage of said central portion therethrough and an annular, second aperture hole permitting passage of said outer peripheral portion therethrough.

3. The electron microscope as set forth in claim 1,
wherein said aperture has a first aperture portion and a second aperture portion;
wherein the first aperture portion has a first aperture hole permitting passage of said electron beam therethrough; and
wherein said second aperture portion has a second aperture hole permitting passage of the central portion of the cross section of the electron beam passed through the first aperture hole and a third aperture hole permitting passage of the outer peripheral portion of the cross section of the electron beam passed through the first aperture hole.

4. The electron microscope as set forth in any one of claims 1 to 3, further comprising a camera length control lens system for controlling the width of the electron beam such that the periphery of the cross section of the central portion of the transmitted electron beam emitted from said sample after impingement of the central portion of the beam on the sample lies within said detection surface of said segmented detector.

5. The electron microscope as set forth in claim 4, further comprising a dark field detector located between said sample and said segmented detector and operative to detect scattered electrons and diffracted electrons out of electrons transmitted through the sample.

6. The electron microscope as set forth in claim 5, wherein said camera length control lens system is mounted between said dark field detector and said segmented detector.

7. A method of measuring an amount of deflection of an electron beam occurring when the beam is transmitted through a sample in an electron microscope equipped with a segmented detector having a detection surface that is divided into a plurality of detector segments, said method comprising the steps of:
placing an aperture having an electron beam blocking portion that provides a blocking shield between a central portion and an outer peripheral portion such that the beam has a central portion and a separated outer peripheral portion impinging on the sample;
adjusting the width of the electron beam such that the periphery of the cross section of the central portion of the transmitted electron beam emitted from the sample in response to impingement of the central portion of the cross section of the beam on the sample lies within the detection surface; and
obtaining electron microscope images from the detector segments, respectively.

\* \* \* \* \*